United States Patent [19]

Cukier et al.

[11] Patent Number: 4,972,360

[45] Date of Patent: Nov. 20, 1990

[54] DIGITAL FILTER FOR A MODEM SIGMA-DELTA ANALOG-TO-DIGITAL CONVERTER

[75] Inventors: Maurice Cukier, Cagnes Sur Mer; Daniel Mauduit, Nice; Gerard Orengo, Biot, all of France

[73] Assignee: International Business Machines Corp., Armonk, N.Y.

[21] Appl. No.: 396,580

[22] Filed: Aug. 21, 1989

[30] Foreign Application Priority Data

Aug. 30, 1988 [FR] France .................. 88 480022

[51] Int. Cl.$^5$ .................. G06F 15/31; H03M 3/00
[52] U.S. Cl. .................. 364/724.04; 364/724.10; 341/143
[58] Field of Search .................. 364/724.01, 724.10, 364/724.04, 724.12, 724.13; 341/143, 77

[56] References Cited

U.S. PATENT DOCUMENTS

| | | | |
|---|---|---|---|
| 3,959,637 | 5/1976 | Nussbaumer | 364/724.04 |
| 3,968,354 | 7/1976 | Ferrieu | 364/724.04 |
| 4,796,004 | 1/1989 | Rich et al. | 341/143 |

OTHER PUBLICATIONS

Proceedings IEEE International Conference on Acoustics, Speech and Signal Processing, 26th-29th Mar. 1985, Tampa, Florida, vol. 3, pp. 1380-1383.
Proceedings IEEE-IECEJ-ASJ International Conference on Acoustics, Speech and Signal Processing, 7th-11th Apr. 1986, Tokyo, vol. 4, pp. 2595-2598.
1987 IEEE International Symposium on Circuits and Systems, 4th-7th May 1987, Philadelphia, PA, vol. 2, pp. 479-482.
G. Jones, Jr., Programmable Transversal Filter, IBM Technical Disclosure, Bulletin, vol. 13, No. 8, Jan. 1971, pp. 2463-2464.

*Primary Examiner*—Dale M. Shaw
*Assistant Examiner*—Long T. Nguyen
*Attorney, Agent, or Firm*—Edward H. Duffield

[57] ABSTRACT

Digital filter used in a sigma-delta decoder wherein each input sample is involved in the computation of three consecutive pulse coded modulation (PCM) output samples. During one sigma-delta sampling period, the filter performs three parallel operations by multiplexing one adder running three times faster than the sigma-delta clock for loading one of three accumulators. As the analog-to-digital converter must be kept in phase with remote modem transmit clock, the PCM sampling clock is controlled by the phase tracking performed by adding or subtracting one period of the crystal oscillator from time to time to the PCM sampling clock period. Rotating the order in which the accumulators are loaded by the adder each PCM sampling time enables having zero as the last coefficient value to add to the accumulator, the contents of which is used as PCM output samples. Thus, each PCM sample value is available in the corresponding accumulator one sigma-delta clock period before the last computation. In case of a correction which shortens or lengthens the PCM sampling period, this correction does not change the PCM sample value to be output since the last computation which is either cancelled or repeated, consists in adding zero to the previous accumulator contents.

10 Claims, 6 Drawing Sheets

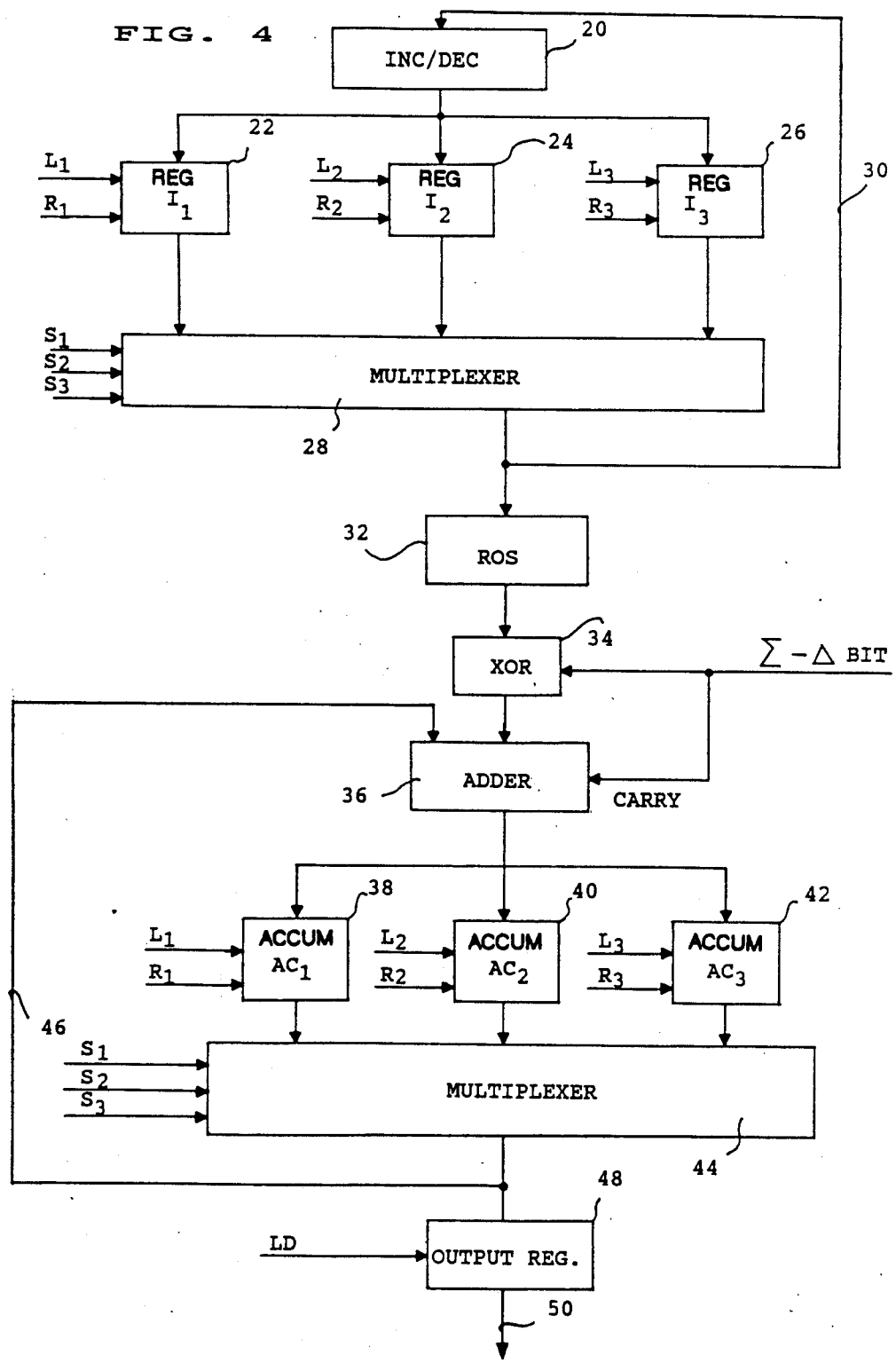

DIGITAL FILTER FOR A MODEM SIGMA-DELTA ANALOG-TO-DIGITAL CONVERTER

FIELD OF INVENTION

The invention relates to analog-to-digital converting devices, and more particularly a digital filter for a sigma-delta analog-to-digital converter used in receiver of a modem.

PRIOR ART

In data transmission systems wherein data are transmitted as analog signals over telephone lines, the digital data to be conveyed are generally represented by modulation states of a carrier signal. The carrier signal is modulated by a modulator at the transmission end and demodulated by a demodulator at the reception end, the modulator/demodulator assembly being called a modem. In present-day modems, all the modulation processing is performed digitally under the control of a signal processor. The digital samples of the modulated carrier have then to be converted into analog form in order to be transmitted over analog telephone lines. This conversion function is generally carried out in a digital-to-analog converter (DAC), such a converter being based, for instance, upon the successive approximation technique. But, there is a trend to replace this type of converter by sigma-delta converters which enable analog components to be replaced by digital equivalents suitable for VLSI implementation.

The analog signals received on the telephone line are converted into digital pulse coded modulation (PCM) samples to be decoded by the signal processor of the modem. The PCM sampling rate at the output of the analog-to-digital converter must be kept in phase with the remote modem transmit clock which has been used for the synchronization of the analog signals received from the remote modem. The frequency of this remote modem transmit clock can be different from the base frequency of the crystal oscillator which provides all the frequencies needed in the modem, and in particular the frequency of the PCM sampling clock. A phase locked oscillator (PLO) is used to track the current remote modem transmit clock so as to adjust the sampling frequency by simply slowing down or speeding up the PCM sampling clock when necessary.

While the phase locked oscillator (PLO) corrections do not impact the operation of the classical analog-to-digital converters, they entail an error in the digital output of the sigma-delta converters. Indeed, a sigma-delta converter is composed of two parts, an analog part which converts the analog signals received on the telephone line into a continuous string of bits at a high frequency, and a digital filter which produces the PCM words samples at a low frequency in response to the continuous string of bits. When a PLO correction occurs by shortening or lengthening the PCM sampling period, this correction results in an error of the PCM sample value which is available at the output of the digital filter. A digital filter which can be used in the sigma-delta converter is described in the article "A Novel Architecture Design for VLSI Implementation of an FIR Decimation Filter" by H. Meleis of the ATT Laboratories, published in IEEE, 1985, page 1380. Its performs the decimation of a 1-bit code at 1024 kHz of double integration sigma-delta modulation output to PCM samples at 16 kHz. The filter response is $Sinc\eta(f)$ which provides attenuation for modulation generated by means of double integration. The implementation of this filter requires the generation of the coefficients, and the performance of the convolution by accumulating the coefficients when the input bit equals 1, during 192 input samples ($1024/16 \times 3$) in three accumulators. The output PCM sample is produced, every 64 input samples, at the output of an accumulator in its turn. Let us assume that, as it is said above, the PCM sampling rate at the output of the filter is no more in phase with the remote modem transmit clock. Though it is not foreseen in the article, a PLO correction can be made by shortening or lengthening the PCM sampling period. In this case either one more coefficient or one less coefficient is accumulated in one accumulator, resulting in an error of the output PCM sample value.

OBJECTS OF INVENTION

Therefore, the object of the invention is an improved digital filter for a sigma-delta converter used in a modem, adapted to avoid an error being introduced in the output PCM value when a PLO correction is taken to slow down or to speed up the clock controlling the output of the PCM samples from the digital filter.

BRIEF SUMMARY OF INVENTION

Accordingly the object of the invention is a digital filter receiving input digital signals at a rate provided by a first clock at a frequency F and providing output digital signals at a rate provided by a second clock at a frequency f which is a submultiple of F, wherein the clock at a frequency f is slowed down or sped up when it is no longer synchronous with a remote clock. The filter is of the type having a finite impulse answer and a number of taps which number is a multiple X of the ratio N between F and f and including a last zero value tap. Such a filter comprises a plurality of accumulators the number of which is equal to the multiple X, for adding at each pulse of the clock F, the product of a predetermined input signal value by one predetermined tap coefficient dependent on the accumulator involved. It also includes processing circuit for loading, during each cycle of the clock F, the product of the input signal value multiplied by the tap coefficient into each one of the plurality of accumulators. An output circuit is also included for providing an output digital signal at a rate f by outputting sequentially the contents of each accumulator at the rate f. Also a selecting circuit is included for selecting the accumulator, the contents of which has been output as the output digital signal, as the accumulator to be loaded first by the processing circuit, whereby the last product which is accumulated in the accumulator to be output is always zero, thus enabling the corresponding time interval to be used for adjustment of frequency F.

BRIEF DESCRIPTION OF DRAWING

The details of a preferred embodiment of the invention may be readily understood from the following description when read in conjunction with the accompanying drawings wherein:

FIG. 4 is a block diagram of a decimating filter incorporating the invention.

DESCRIPTION OF PREFERRED EMBODIMENT

Figure 1:
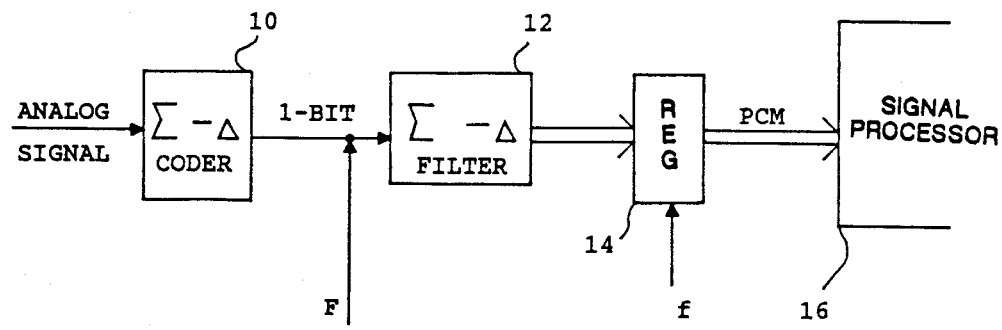
FIG. 1 is a schematic diagram of a sigma-delta analog-to-digital converter.

In reference to FIG. 1, the analog signal received from the telephone line is converted into a continuous string of bits at a high frequency F, which is 864 kHz in the present embodiment, by sigma-delta coder 10. Then, a digital filter 12 according to the invention produces PCM words which are loaded in register 14 and sampled at a frequency f=14.4 kHz in order to be used by signal processor 16 of the modem. It is assumed that the words include 16 bits but this is not a significant feature for the invention.

Sigma-delta coder 10 is not a part of the invention and therefore, will not be described in detail here. A description of a sigma-delta coder which could be used in the invention can be found in the Article "A Unity Bit Coding Method by Negative Feedback" published in Proceedings IEEE, vol 51, Pages 1524–1535, November 1963, and the Article "A Use of Double Integration in Sigma-delta Modulation" published in IEEE Trans. Comm., Vol. Com-34, Pages 72–76, January 1986.

The clocks providing frequencies f and F are generally generated from a single clock which provides all the frequencies needed in the modem. This single clock is derived from a crystal oscillator. In the present embodiment, such a modem clock can have a frequency of 2.592 mHz which is divided by 3 to provide the 864 kHz sigma-delta clock (F), and divided by 180 to generate the 14.4 kHz PCM sampling clock.

Figure 2:
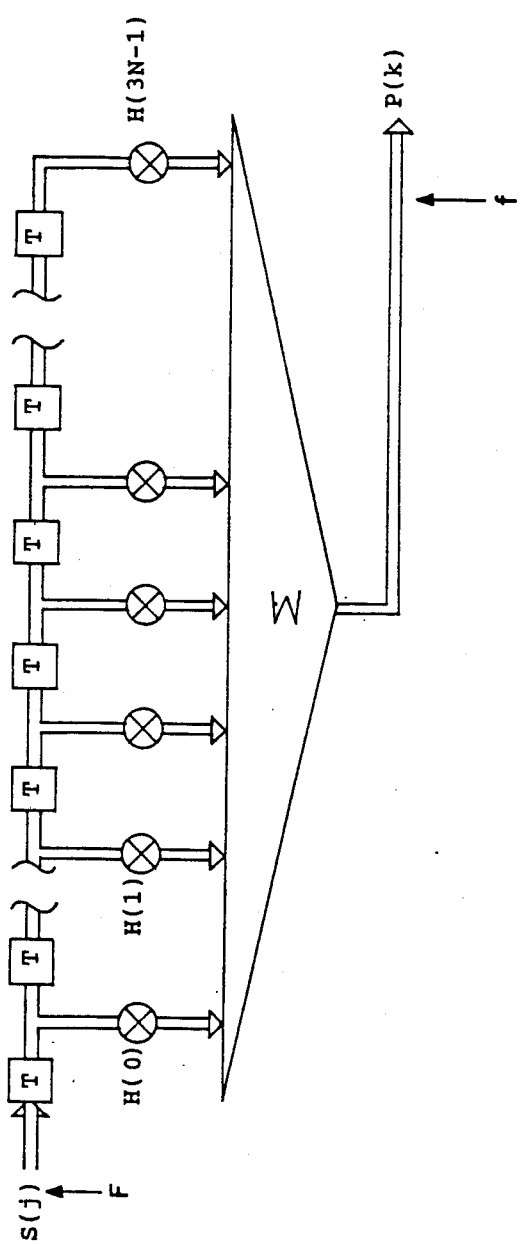
FIG. 2 is functional representation of a digital filter wherein the present invention is implemented.

Digital filter 12 is shown in a functional manner on FIG. 2. Assuming that N is the value of the ratio between the sigma-delta sampling rate and the PCM sampling rate (N is also called the decimation factor), filter 12 is of $Sinc\eta(f)$ type which provides attenuation for modulation generated by means of double integration. Such a filter includes 3N coefficients which are computed in the following way :

$$H(n) = n(n + 1)/2 \text{ for } n = 0 \ldots N - 1 \quad (1)$$

$$H(n) = N(N + 1)/2 + (n - N)(2N - 1 - n)$$
$$\text{for } n = N \ldots 2N - 1$$

$$H(n) = (3N - n - 1)(3N - n)/2 \text{ for } n = 2N \ldots 3N - 1$$

As shown on FIG. 2, the filter action consists in averaging 3N input samples for computing every PCM output sample. Each cell of the filter introduces a delay of T=1/F. In the embodiment of the invention, filter 12 includes $$\frac{3 \times 864}{14.4} = 180 \text{ coefficients}$$

and the delay T=1/864 ms.

For the sake of simplicity, let us assume that N=4 in the following example. In this case the filter has 3N=12 coefficients among which 10 are different from zero. These coefficients are the following:

| n    | 0 | 1 | 2 | 3 | 4  | 5  | 6  | 7  | 8 | 9 | 10 | 11 |
|------|---|---|---|---|----|----|----|----|---|---|----|----|
| H(n) | 0 | 1 | 3 | 6 | 10 | 12 | 12 | 10 | 6 | 3 | 1  | 0  |

Let S(j) with j=1, 2, 3, . . . be the samples (corresponding to the continuous string of bits) which are input to sigma-delta filter 12, and P(j) the PCM samples which are produced at the output of sigma-delta filter 12. Since N=4 the output rate is F/4 with F being the input rate, and the PCM sample P(j) are produced for j=4, 8, 12, . . .

As shown on Table I each PCM sample can be expressed by the following formula:

$$P_{(12+4k)} = \sum_{j=1}^{12} S_{(j+4k)} \cdot H_{(j-1)} \text{ with } k = 1, 2, \ldots$$

TABLE I

| | | | |
|---|---|---|---|
| S(1).H(0) | | | |
| + S(2).H(1) | | | |
| + S(3).H(2) | | | |
| + S(4).H(3) | | | |
| + S(5).H(4) | S(5).H(0) | | |
| + S(6).H(5) | + S(6).H(1) | | |
| + S(7).H(6) | + S(7).H(2) | | |
| + S(8).H(7) | + S(8).H(3) | | |
| + S(9).H(8) | + S(9).H(4) | S(9).H(0) | |
| + S(10).H(9) | + S(10).H(5) | + S(10).H(1) | ← j = 10 |
| + S(11).H(10) | + S(11).H(6) | + S(11).H(2) | |
| + S(12).H(11) | + S(12).H(7) | + S(12).H(3) | |
| P(12) | + S(13).H(8) | + S(13).H(4) | S(13).H(0) |
| | + S(14).H(9) | + S(14).H(5) | + S(14).H(1) |
| | + S(15).H(10) | + S(15).H(6) | + S(15).H(2) |
| | + S(16).H(11) | + S(16).H(7) | + S(16).H(3) |
| | P(16) | + S(17).H(8) | + S(17).H(4) |
| | | + S(18).H(9) | + S(17).H(5) |
| | | + S(19).H(10) | + S(17).H(6) |
| | | + S(20).H(11) | + S(17).H(7) |
| | | P(20) | . |

It can be observed that each sample S(j) is involved in the computation of 3 output samples. For example as shown on Table I, S(10) is involved in the following computations:

P(12) with H(9)=3

P(16) with H(5)=12

P(20) with H(1)=1

Figure 3:
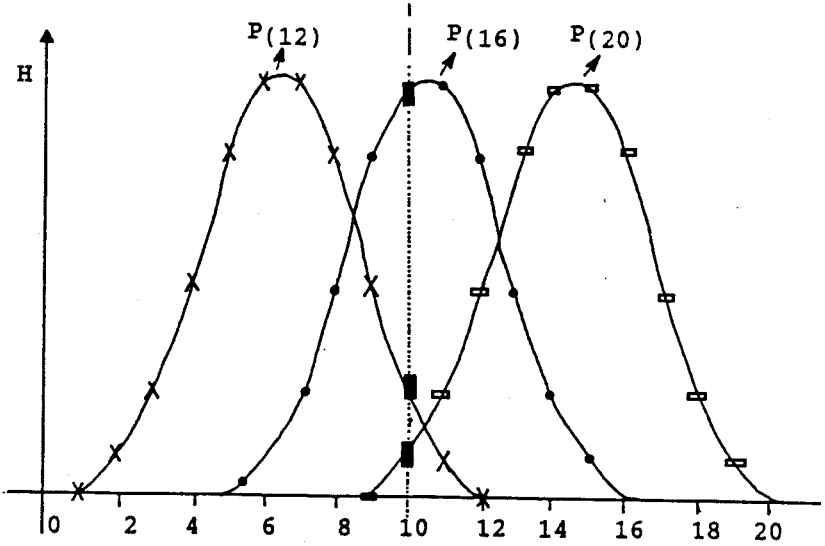
FIG. 3 is a diagram representing the impulse response of a digital filter of the $Sinc\eta$ type.

Such a particularity clearly appears on FIG. 3 wherein each curve is composed by points representing each one of the filter coefficients H(j) with j=0 to 11, as defined hereabove.

The implementation of the filter shown on FIG. 2 can be simplified by taking into account the fact that input samples S(j) take only two values: +1 (corresponding to a bit 0) and −1 (corresponding to a bit 1). This reduces the complexity of the filter by changing each multiplication into one addition or one subtraction.

As discussed above, each input sample S(j) is involved in the computation of three consecutive output samples: the first one with weighting H(n), the second one with H(n+N) and the third one with H(n+2N). Therefore, three accumulators are sufficient for implementing the filter. During one sigma-delta period, the filter has to perform three parallel operations. This may be carried out, in an efficient manner, by multiplexing one adder running three times faster. For instance, in the present implementation, the adder has to perform three operations each period of the clock F=864 kHz. This means that the adder runs at the frequency of the modem oscillator at 2.592 kHz.

FIG. 4 depicts a decimating filter according to the present invention. Three registers 22, 24 and 26 are alternatively loaded with index values $I_1$, $I_2$ and $I_3$, during each period of clock F. In fact, each period of clock F is divided in three cycles which are periods of the modem oscillator at 2.592 kHz in the preferred embodiment.

Each index register Ii (i being 1, 2 or 3) is loaded during one of these cycles by the activation of the corresponding load signal Li. In the same way, multiplexer 28 is activated by a select signal Si to select register Ii. Normally at each cycle, the value of one register selected by multiplexer 28 is input by line 30 to incrementer/decrementer 20 wherein it is incremented before being loaded into the corresponding register. The manner and the sequence order used to activate the load signals, as well as the select signals, constitutes one of the essential features of the invention and will be explained hereafter.

It must be noted that the impulse response of the Sinc$\eta$ filter is symmetrical as can be deduced from the equations (1). 3N/2 coefficients are thus needed instead of 3N. Therefore, if N is even, indexes vary from 0 up to 3N/2−1 and then from 3N/2−1 down to 0. If N is odd, indexes vary from 0 to (3N+1)/2 and then from (3N−1)/2 down to 0. For example in the preferred embodiment N=60 and accordingly, indexes vary from 0 to 89 and then from 89 to 0. Such an incrementation/decrementation is easily performed by incrementer/decrementer 20.

The index value output from multiplexer 28 is used as address to Read Only Storage (ROS) 32 to provide the corresponding filter coefficient. It should be noted that, in the present implementation, only 3N/2 coefficients (90 in the preferred embodiment) are to be stored.

As already explained, the input sample S(j) equals +1 when the corresponding sigma-delta bit is 0, and equal −1 when the sigma-delta bit is 1. It is why the coefficient provided by ROS 32 is input to a XOR logic 34 which also receives the sigma-delta bit as other input. Therefore, the binary value of the coefficient remains unchanged when the sigma-delta bit is 0, and is complemented by XOR logic 34 when the sigma-delta bit is 1. The output of XOR logic 34 is provided to adder 36 wherein it is used for the accumulation of the PCM sample value as it will be explained. At this point it must be noted that a sigma-delta bit "1" for which the input sample S(j) equal −1, is also used as a carry for adder 36 to obtain a binary value which represents the inverted value of the corresponding coefficient output from ROS 32.

In the same way as for index registers 22, 24 and 26, three accumulators 38, 40 and 42 are alternatively loaded with the result of the addition carried out by adder 36, during each period of clock F. With the same sequence order as for the index registers, multiplexer 44 is activated during one cycle, by a select signal Si (i being 1, 2 or 3) to select the contents of accumulator ACi which are fed back by line 46 as input to adder 36 wherein they are added to a new coefficient if the sigma-delta sample is 0, or to the inverted coefficient if the sigma-delta sample is 1.

Now, after N coefficients have been accumulated in one accumulator, its contents are provided as PCM sample value to output register 48. For this, a load signal LD which is provided at PCM frequency f is activated to output the contents of register 48 on output line 50, and to load the new PCM value from the accumulator which has just been selected. Then, this accumulator is reset by the activation of a reset signal Ri (i being the order number of the accumulator).

At this point of the description, it must be recalled that the PCM sampling rate at the output of the modem converter must be kept in phase with the remote modem transmit clock. This is carried out by controlling the sampling clock through a digital phase-locked oscillator (PLO). Phase tracking is simply performed by adding or subtracting one or more PLO steps from time to time to the sampling clock period. Obviously, a smaller PLO step size will result in smoother clock corrections. As it is said above, all timings of the modem are derived from a single clock (a crystal oscillator at 2.592 kHZ in the preferred embodiment) which feeds a programmable divider to produce clock F by a first division by 3, and clock f by a division by N. The programmable divider is under the control of the signal processor 16 of the modem. When a PLO correction is needed, the signal processor changes the default value of the programmable divider. This allows adding or skipping cycles of the oscillator. Once the correction is performed, the programmable divider returns to its default value.

A PLO correction could introduce, if no improvement was brought to the prior system, the accumulation of one more coefficient or the loss of one coefficient resulting in a error of the output PCM sample value. The essential feature of the invention avoids such an error from being made as explained hereafter.

As already mentioned (see equations (1)), the filter coefficients are divided in three "windows":

| | |
|---|---|
| Window 1 | H(0), ..., H(N − 1) |
| Window 2 | H(N), ..., H(2N − 1) |
| Window 3 | H(2N), ..., H(3N − 1) | and, as shown in FIG. 3, any input sample S(j) is multiplied by one coefficient from each filter window.

Since the last coefficient H(3N-1) is equal to 0, the value of the PCM output sample is available in the corresponding accumulator one sigma-delta period (clock F) before it is to be loaded in the output register. Therefore, if the last accumulation with coefficient 0 is always computed last, the results of the computations will not be affected if this accumulation is either skipped, when a PLO correction shortens the sampling interval, or performed twice, when a PLO correction lengthens the sampling interval. Accordingly, on each PCM sampling pulse, the accumulators are "rotated" in such a way that coefficients of window 1 are always handled first, then coefficients of window 2 and last, coefficients of window 3, whereby the last accumulation of window 3 (which can be affected by a PLO correction) always corresponds to the last coefficient equal to 0.

Figure 5:
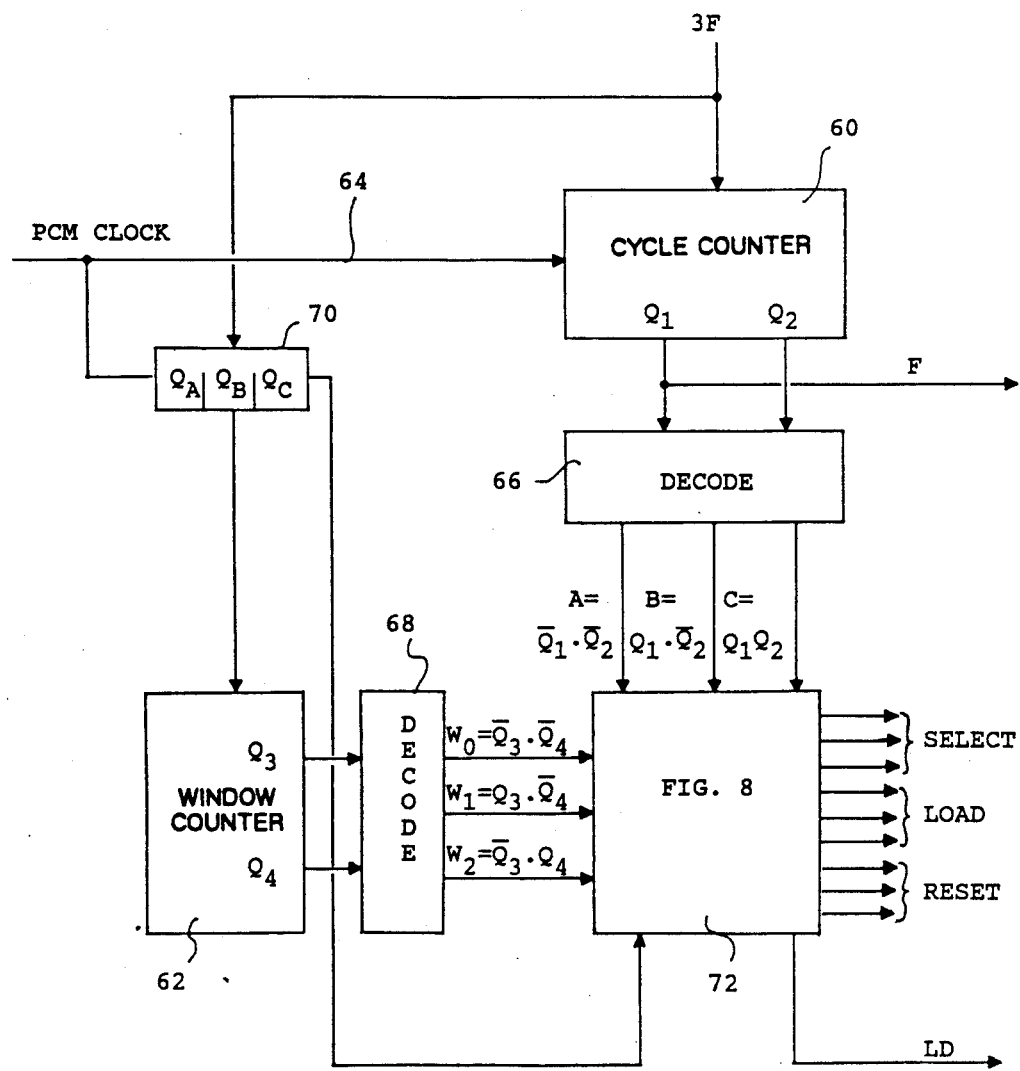
FIG. 5 is a block diagram representing the logic circuitry which generates the signals enabling the filter of FIG. 4 to operate.

The details of the invention enabling this handling to be incorporated in the filter operations are now described in reference to FIG. 5.

The implementation shown on FIG. 5 involves two counters: a cycle counter 60 which produces the sigma-delta clock F from the oscillator of frequency 3F, and a window counter 62 which is incremented every time a PCM sample is loaded into the output register.

As already explained, PLO corrections consist in speeding up or slowing down the PCM sampling clock. The PCM clock signal, on line 64, is therefore provided as input to cycle counter 60 for the latter to take the PLO corrections into account. An implementation of such a cycle counter can be made by using a state generator as shown on FIG. 6. Normally, the PCM clock signal, active during one cycle of the oscillator 3F, is active two cycles before the output register 48 of FIG. 4 is to be loaded with the contents of an accumulator. If there is no PLO correction, the PCM clock signal can be active only during state A. In this case, the system goes from state A to state B, from state B to state C, and from state C to state A, without interruption. In this case, cycle counter 60 is a "divide by 3" counter. It must be noted that, in the figure, P represents the occurrence of the PCM clock signal and $\bar{P}$ represents the non-occurrence of the PCM clock signal.

When an extra cycle is added by the PLO correction to the sampling interval which means that the PCM clock is slowed down, the PCM clock signal P is active during state B. This results in adding state C' in the period of the cycle counter. When a cycle is suppressed from the sampling interval, which means that the PCM clock is sped up, the PCM clock signal P is active during state C. In this case, two additional states A' and B' are added to the period of the cycle counter. It should be noted that states A and A' correspond to accumulation of coefficients from window 1, states B and B' to window 2 and states C and C' to window 3. PLO corrections only affect coefficients of window 3 by adding state C' or skipping state C.

Only 3 states are necessary in the state generator since A', B' and C' are respectively identical to A, B and C. This requires that only two variables be used in the circuit. These variables $Q_1$, $Q_2$ can take the following values when, associated with the different states.

|  |  | $Q_1$ | $Q_2$ |
|---|---|---|---|
| A (or A') | → | 0 | 0 |
| B (or B') | → | 0 | 1 |
| C (or C') | → | 1 | 1 |

Figure 6:
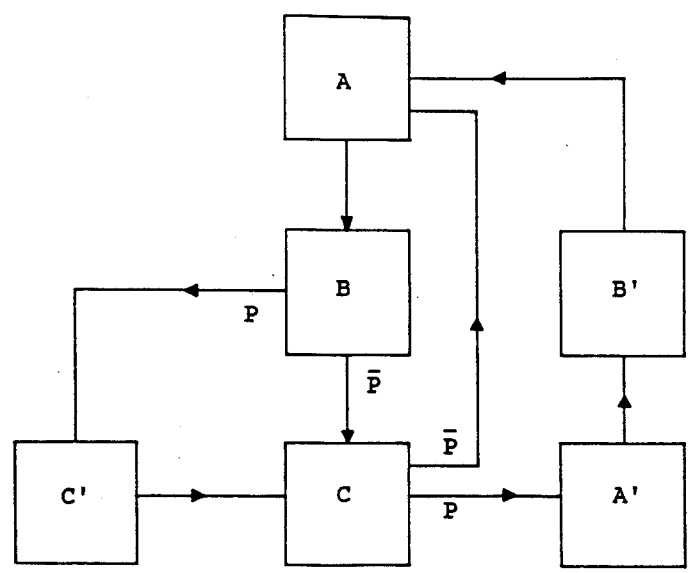
FIG. 6 is a schematic diagram of a state generator implementing the cycle counter incorporated in the logic circuitry of FIG. 5.

To comply with the state generator of FIG. 6, cycle counter 60 which provides outputs $Q_1$, $Q_2$, is determined easily by a method which will not be explained, as being not an essential feature of the invention.

Decode circuit 66 is a logic circuit providing the value of A, B, C, in function of the two variables. $Q_1$ and $Q_2$ taking the binary values mentioned above. Accordingly, decode circuit 43 provides the three outputs:

$A = \bar{Q}_1 . \bar{Q}_2$ $B = Q_1 . \bar{Q}_2$ $C = Q_1 . Q_2$

Figure 7:
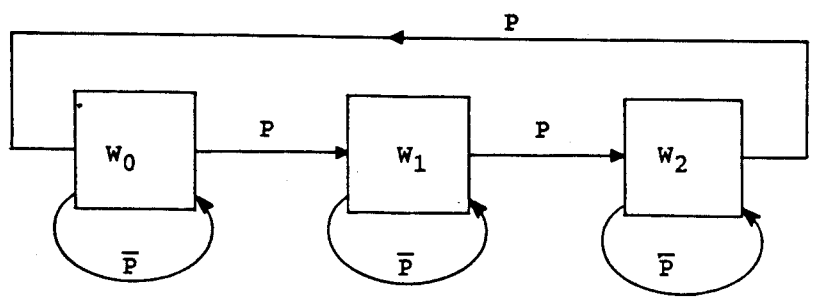
FIG. 7 is a schematic diagram of a state generator implementing the window counter incorporated in the logic circuitry of FIG. 5.

Likewise, the implementation of window counter 62 can be made by using a state generator as shown on FIG. 7. It includes three states W0, W1, W2. The system remains in a state W0, W1 or W2 as long as there is no PCM clock signal (represented by $\bar{P}$), and goes to the following state when a PCM clock signal occurs (represented by P).

As for the state generator supporting the cycle counter, the window counter is determined easily by a method resulting from the state generator of FIG. 7, which will not be explained as being not an essential feature of the invention.

As three states are necessary, the state generator supporting the window counter requires that two variables be used in the circuit. These variables $Q_3$, $Q_4$ can take the following values when associated with the different states.

|  |  | $Q_3$ | $Q_4$ |
|---|---|---|---|
| W0 | → | 0 | 0 |
| W1 | → | 1 | 0 |
| W2 | → | 0 | 1 |

Accordingly, decode circuit 68 is a logic circuit providing the value of W0, W1 and W2 in function of the two variable $Q_3$, and $Q_4$:

$W0 = \bar{Q}_3 . \bar{Q}_4$ HD 4

$W1 = Q_3 . \bar{Q}_4$ $W2 = \bar{Q}_3 . Q_4$

Coming back to the operation of the filter device shown on FIG. 4, when window counter 62 is in state W0 (00), accumulation is performed first in accumulator AC1 with coefficients of window 1, then in accumulator AC3 with window 2 and finally in accumulator AC2 with window 3. When window counter 62 is in state W1(01), accumulation is performed first in accumulator AC2 with coefficients of window 1, then in accumulator AC1 with window 2 and finally in accumulator AC3 with window 3. When the window counter is in state W2(10), accumulation is performed first in accumulator AC3 with coefficient of window 1, then in accumulator AC2 with window 2 and finally in accumulator AC1 with window 3. It can be seen that it is the accumulator which is selected last to accumulate the coefficients of window 3, and therefore providing the PCM sample value, which is used as first accumulator (for the window 1 coefficients) after the result of the accumulation has been output. Such a rule can be clearly shown in the following table II.

TABLE II

|  | A | B | C |
|---|---|---|---|
| W0 | AC1 → | AC3 → | AC2 |

TABLE II-continued

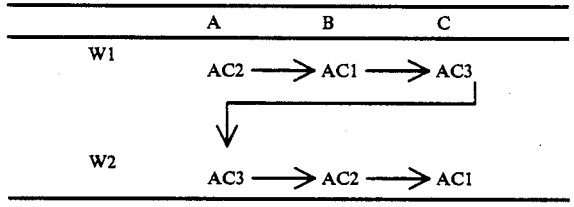

For each state W0, W1 and W2, the PCM sample value is present in the accumulator which is in the box.

As shown in FIG. 5, the PCM clock signal is delayed by two cycles in shift register 70 for the incrementation of window counter 62, and by three cycles for the signal LD which enables the output register to be loaded with the PCM sample as will be seen later in reference to FIG. 8. Indeed, window counter 62 is incremented every time a PCM sample is output. This incrementation is initiated by the occurrence of the PCM clock signal. As it is impossible to react immediately on cycle A to the occurrence of the PCM clock on cycle A when there is no PLO correction, and of course, impossible to react on cycle A if the PCM clock signal occurs on cycle B when there is a slowed down PCM clock pulse, a delay of two cycles enables window counter 62 to be ready for the cycle A which follows the occurrence of the PCM clock signal.

Figure 8:
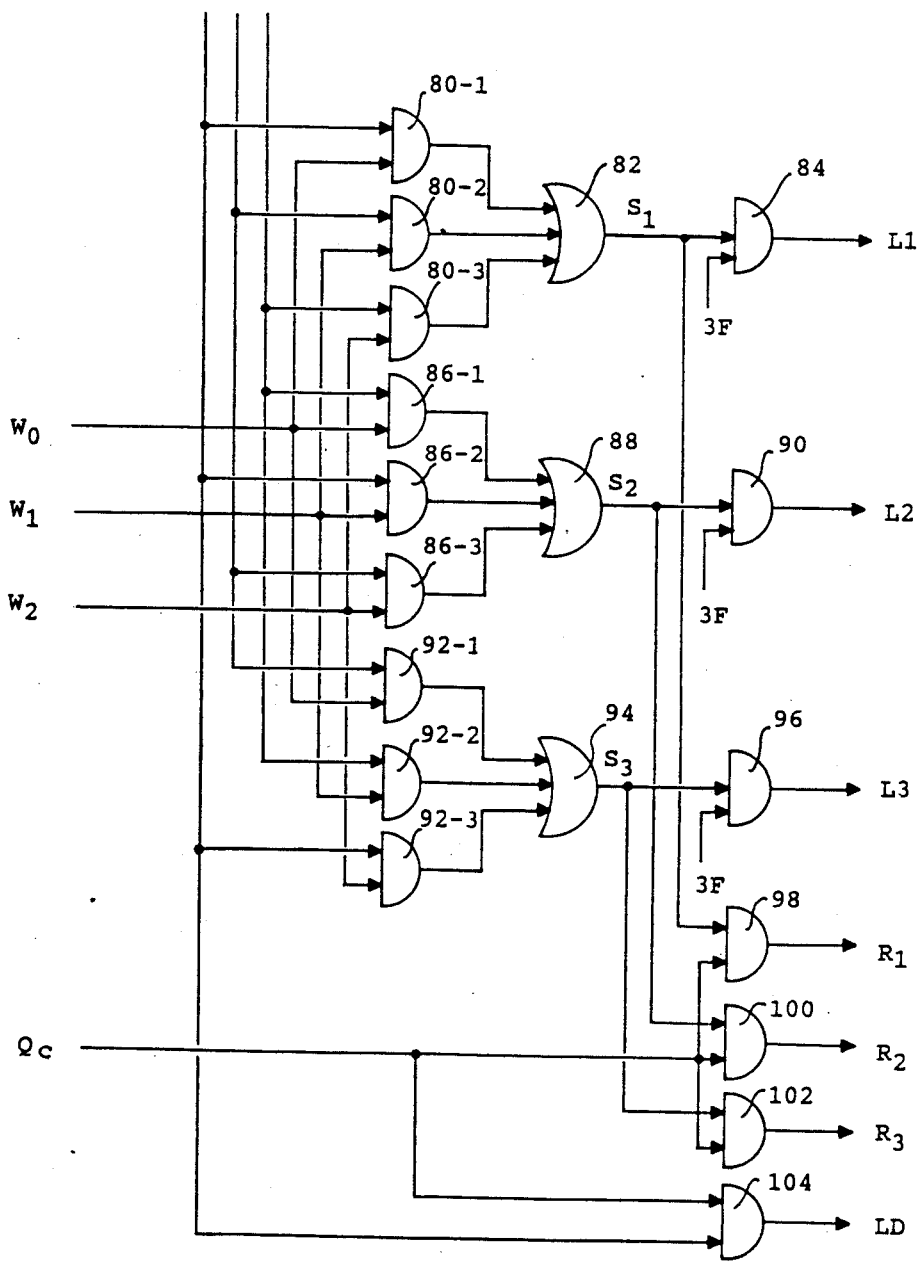
FIG. 8 is a block diagram representing the logic block incorporated in the logic circuitry of FIG. 5, for generating all signal controlling the operation of the decimating filter according to the invention.

The logic circuitry (represented by block 72 on FIG. 5) generating all the signals controlling the operation of the decimation filter is shown in details on FIG. 8.

As already explained, when window counter 62 is in state W0 (that is W0=1 and W1=W2=0), AND circuit 80-1 is activated and enables the coefficients of window 1 to be accumulated, during cycle A, in accumulator AC1 since load signal L1 is active by means of OR circuit 82 and AND circuit 84. It must be noted that select signal S1 which enables multiplexers 28 and 48 to be selected, is provided at the output of OR circuit 82 during the complete cycle A, while load signal L1 which results from the combination of this select signal S1 and oscillator clock 3F, is activated after signal S1 is available. This time difference enables index registers I1, I2, I3 and accumulators AC1, AC2, AC3 (see FIG. 4) to be selected before being loaded by a new value.

Then, during cycle B, AND circuit 92-1 is activated and enables the coefficient of window 2 to be accumulated in accumulator AC3 with the activation of load signal L3 by means of OR circuit 94 and AND circuit 96. In the same way as for select signal S1, select signal S3 is made available half a cycle of clock 3F before load signal L3 is available.

At last, during cycle C, AND circuit 86-1 is activated and enables the coefficients of window 3 to be accumulated in accumulator AC2 with the activation of load signal L2 by means of OR circuit 88 and AND circuit 90. At the output of OR circuit 88, select signal S2 is made available half a cycle of clock 3F before load signal L2.

The above sequence is repeated as long as window counter 62 is in state W0. As soon as a PCM clock signal P occurs, either during cycle A (no PLO correction) or during cycle B (the PCM clock is slowed down), or during cycle C (the PCM clock is sped up), window counter 62 goes from state W0 to state W1 (see FIG. 7). In this state, AND circuit 86-2 is activated first during cycle A, then AND circuit 80-2 during cycle B and finally AND circuit 92-2 during cycle C. This sequence enables the activation of select signal S2 and load signal L2 (resulting in the accumulation of the window 1 coefficient in accumulator AC2) by means of OR circuit 88 and AND circuit 90, then the activation of select signal S1 and load signal L1 (resulting in the accumulation of the window 2 coefficient in accumulator AC1) by means of OR circuit 82 and AND circuit 84, and finally the activation of select signal S3 and load signal L3 (resulting in the accumulation of the window 3 coefficient in accumulator AC3) by means of OR circuit 94 and AND circuit 96.

Again, when a PCM clock signal occurs, window counter 62 goes from state W1 to state W2. In this case, select signal S3 and load signal L3 are activated first (resulting in the accumulation of the window 1 coefficient in accumulator AC3) during cycle A, by means of AND circuit 92-3, OR circuit 94 and AND circuit 96, then select signal S2 and load signal L2 are activated (resulting in the accumulation of the window 2 coefficient in accumulator AC2) during cycle B, by means of AND circuit 86-3, OR circuit 88 and AND circuit 90, and finally select signal S1 and load signal L1 are activated (resulting in the accumulation of the window 3 coefficient in accumulator AC1) during cycle C, by means of AND circuit 80-3, OR circuit 82 and AND circuit 84.

As shown on FIG. 8, signal QC which is activated by the PCM clock signal delayed by three cycles 3F in shift register 70 (see FIG. 5), is used to generate next signals R1, R2, R3, and load signal LD.

Reset signals R1, R2 and R3 are provided respectively by AND circuit 98, AND circuit 100 and AND circuit 102. Each reset signal is activated by the occurrence of the corresponding select signal. As the select signal has been generated by the occurrence of the signal W0, W1 or W2 from the window counter, itself activated by the PCM clock signal delayed by 2 cycles 3F, this means that the reset signal, which occurs at the instant of QC (the PCM clock signal delayed by 3 cycles 3F), is delayed of one cycle 3F with respect to the corresponding select signal.

As far as the signal LD is concerned, the delay of 3 cycles 3F is necessary in view of the PLO corrections. Indeed, the end of each accumulation of the filter coefficients in one of the accumulators always occurs during cycle C when there is no PLO correction. Assuming that a speeding up PLO correction occurs, this means that a cycle C is skipped. The result of the accumulation is already available in the accumulator since the last coefficient is 0, but it is not possible to output the accumulated value on the missing cycle C as it would be possible in the absence of any PLO correction. As already explained, the accumulators are "rotated" in such a way that it is the accumulator providing the PCM sample value which is selected first at the next cycle. Therefore, the PCM sample, value is present in this accumulator during next cycle A. It is for this reason that the signal LD which enables output register 48 to provide the PCM sample value, occurs on a cycle A but delayed by three cycles 3F (signal QC from shift register 70 on FIG. 5) in AND circuit 104.

Again, for sake of simplicity, examples are given by taking N=4, which means that the decimation filter has 12 coefficients H(n) with n=0, 1, . . . , 11 and H(0)=H(11)=0.

TABLE III

| SAMPLES | | AC 1 | AC 2 | AC3 | PCM SAMPLE |
|---|---|---|---|---|---|
| 1 | 1 | 0 | | | P(0) from AC 1 |
| | 2 | | | + H(4) | |
| | 3 | | + H(8) | | |
| 2 | 1 | + H(1) | | | |
| | 2 | | | + H(5) | |
| | 3 | | + H(9) | | |
| 3 | 1 | + H(2) | | | |
| | 2 | | | + H(6) | |
| | 3 | | + H(10) | | |
| 4 | 1 | + H(3) | | | |
| | 2 | | | + H(7) | |
| | 3 | | + 0 | | |
| 5 | 1 | | 0 | | P(4) from AC 2 |
| | 2 | + H(4) | | | |
| | 3 | | | + H(8) | |
| 6 | 1 | | + H(1) | | |
| | 2 | + H(5) | | | |
| | 3 | | | + H(9) | |
| 7 | 1 | | + H(2) | | |
| | 2 | + H(6) | | | |
| | 3 | | | + H(10) | |
| 8 | 1 | | + H(3) | | |
| | 2 | + H(7) | | | |
| | 3 | | | + 0 | |
| 9 | 1 | | | 0 | P(8) from AC 3 |
| | 2 | | + H(4) | | |
| | 3 | + H(8) | | | |
| 10 | 1 | | | + H(1) | |
| | 2 | | + H(5) | | |
| | 3 | + H(9) | | | |
| 11 | 1 | | | + H(2) | |
| | 2 | | + H(6) | | |
| | 3 | + H(10) | | | |
| 12 | 1 | | | + H(3) | |
| | 2 | | + H(7) | | |
| | 3 | + 0 | | | |
| 13 | 1 | 0 | | | P(12) from AC 1 |
| | 2 | | | + H(4) | |
| | 3 | | + H(8) | | |
| 14 | 1 | + H(1) | | | |
| | 2 | | | + H(5) | |
| | 3 | | + H(9) | | |

First, assuming that there is no PLO action, table III illustrates the order of computation for the input samples S(j) with j varying from 1 to 14. The first column of the table gives the number of the input samples. For each input sample, the first column includes the sequences 1, 2, 3 designating the three cycles of clock 3F during which each of the three accumulators is used to accumulate a filter coefficient (or its opposite) represented by the second, third and fourth columns. The fifth column gives the PCM sample which is produced every four accumulations, and alternatively from each accumulator.

It can be seen from Table II that the last filter coefficient H(11) (and also the first filter coefficient) has been written in its value 0. This means that each PCM sample value is available in the corresponding accumulator one cycle before the last accumulation takes place. Since the accumulator providing the PCM sample is "rotated" and used as first accumulator for the next computations, the PCM sample is available in the next-selected accumulator at the beginning of the next cycle. Thus, during the three cycles where input sample S(8) is present, three accumulations are performed.

1. AC2 = AC2 + S(8).H(3)

2. AC1 = AC1 + S(8).H(7)

3. AC3 = AC3 + S(8).H(11) = AC3

For next input sample S(9), the contents of AC3, which represent the PCM sample P(8), are transferred to the output register and AC3 is reset. Then the accumulation order becomes:

1. AC3 = S(9).H(0) = 0

2. AC2 = AC2 + S(9).H(4)

3. AC1 = AC1 + S(9).H(8)

TABLE IV

| SAMPLES | | AC 1 | AC 2 | AC3 | PCM SAMPLE |
|---|---|---|---|---|---|
| 1 | 1 | 0 | | | P(0) from AC 1 |
| | 2 | | | + H(4) | |
| | 3 | | + H(8) | | |
| 2 | 1 | + H(1) | | | |
| | 2 | | | + H(5) | |
| | 3 | | + H(9) | | |
| 3 | 1 | + H(2) | | | |
| | 2 | | | + H(6) | |
| | 3 | | + H(10) | | |
| 4 | 1 | + H(3) | | | |
| | 2 | | | + H(7) | |
| | 3 | | + 0 | | |
| 5 | 1 | | 0 | | P(4) from AC 2 |
| | 2 | + H(4) | | | |
| | 3 | | | + H(8) | |
| 6 | 1 | | + H(1) | | |
| | 2 | + H(5) | | | |
| | 3 | | | + H(9) | |
| 7 | 1 | | + H(2) | | |
| | 2 | + H(6) | | | |
| | 3 | | | + H(10) | |
| 8 | 1 | | + H(3) | | |
| | >>>2 | | + H(7) | | |
| 9 | 1 | | | 0 | P(8) from AC 3 |
| | 2 | | + H(4) | | |
| | 3 | + H(8) | | | |
| 10 | 1 | | | + H(1) | |
| | 2 | | + H(5) | | |
| | 3 | + H(9) | | | |
| 11 | 1 | | | + H(2) | |
| | 2 | | + H(6) | | |
| | 3 | + H(10) | | | |
| 12 | 1 | | | + H(3) | |
| | 2 | | + H(7) | | |
| | 3 | + 0 | | | |
| 13 | 1 | 0 | | | P(12) from AC 1 |
| | 2 | | | + H(4) | |
| | 3 | | + H(8) | | |
| 14 | 1 | + H(1) | | | |
| | 2 | | | + H(5) | |
| | 3 | | + H(9) | | |

Table IV illustrates the case when there is a PLO correction speeding up the PCM clock. As already explained, the sampling period is shortened by suppression of a cycle C. Thus, in the present case, the third cycle corresponding to the computation with input sample S(8) is suppressed. Such a suppression results in no error since the accumulation during this cycle corresponded to coefficient H(11) = 0. Therefore, the PCM sample value is taken from the preceding accumulation S(7).H(10) which is still present in AC3.

TABLE V

| SAMPLES | | AC 1 | AC 2 | AC3 | PCM SAMPLE |
|---|---|---|---|---|---|
| 1 | 1 | 0 | | | P(0) from AC 1 |
| | 2 | | | + H(4) | |
| | 3 | | + H(8) | | |
| 2 | 1 | + H(1) | | | |
| | 2 | | | + H(5) | |
| | 3 | | + H(9) | | |
| 3 | 1 | + H(2) | | | |
| | 2 | | | + H(6) | |
| | 3 | | + H(10) | | |

TABLE V-continued

| SAMPLES | | AC 1 | AC 2 | AC3 | PCM SAMPLE |
|---|---|---|---|---|---|
| 4 | 1 | + H(3) | | | |
| | 2 | | | + H(7) | |
| | 3 | | + 0 | | |
| 5 | 1 | | 0 | | P(4) from AC 2 |
| | 2 | + H(4) | | | |
| | 3 | | | + H(8) | |
| 6 | 1 | | + H(1) | | |
| | 2 | + H(5) | | | |
| | 3 | | | + H(9) | |
| 7 | 1 | | + H(2) | | |
| | 2 | + H(6) | | | |
| | 3 | | | + H(10) | |
| 8 | 1 | | + H(3) | | |
| | 2 | + H(7) | | | |
| | 3 | | | + 0 | |
| >>>4 | | | | + 0 | |
| 9 | 1 | | | 0 | P(8) from AC 3 |
| | 2 | | + H(4) | | |
| | 3 | + H(8) | | | |
| 10 | 1 | | | + H(1) | |
| | 2 | | + H(5) | | |
| | 3 | + H(9) | | | |
| 11 | 1 | | | + H(2) | |
| | 2 | | + H(6) | | |
| | 3 | + H(10) | | | |
| 12 | 1 | | | + H(3) | |
| | 2 | | + H(7) | | |
| | 3 | | + 0 | | |
| 13 | 1 | | 0 | | P(12) from AC 1 |
| | 2 | | | + H(4) | |
| | 3 | | + H(8) | | |
| 14 | 1 | + H(1) | | | |
| | 2 | | | + H(5) | |
| | 3 | | + H(9) | | |

Table V illustrates the case when there is a PLO correction slowing down the PCM clock, resulting in lengthening the sampling period by a cycle C'. Thus, in the present case, the last accumulation in AC3 is performed twice (during cycles 3. and 4.). Such an addition of a supplementary cycle has no consequence on the result since the corresponding filter coefficient H(11)=0. The last significant accumulation corresponding to S(7).H(10) is present in AC3 during three cycles.

As it has already been mentioned, the essential feature of the invention is the "rotation" of the accumulators enabling PLO corrections to be made by skipping or repeating a cycle C without entailing an error in the PCM sample computation. PLO corrections resulting in skipping or repeating a cycle C are corrections which respectively shorten the sampling interval (when the PCM clock is sped up) or lengthen the sampling interval (when the PCM clock is slowed down). In fact, it is possible to perform phase tracking by adding or subtracting three PLO steps to the sampling clock period provided that the impulse response of the decimating filter has its first coefficient equal to 0 (this is not necessary when only one PLO step is added or subtracted). Assuming that a PLO correction is performed by shortening the sampling period by three elementary cycles, this means that the PCM clock signal occurs three cycles earlier. Such an action does not impact the clock F since the PCM clock signal still occurs on a cycle A. As in the case of a shortening PLO action by one cycle, the contents of the accumulator operating on window 3 are output as the PCM sample value. The PLO action results in no error on this value since the missing computation involves last coefficient H(11)=0.

Now, if the PLO correction is performed by lengthening the sampling period by three cycles, the PCM clock signal occurs three cycles later. Again, the PLO action does not impact the clock F since the PCM clock signal occurs on a cycle A. As when the PLO action consists in lengthening the PCM sampling period by only one cycle, the accumulator operating on window 3 contains the PCM sample value to be output. Due to the delay of the PCM clock signal, the contents of this accumulator are not output at the end of the PCM sampling period, but only at the end of the first cycle of the next PCM sampling period. This does not result in an error since the first coefficient is H(0)=0.

Though the preferred embodiment of the invention includes a decimating filter which is of the $Sinc^2$ type, it is possible to use a filter of another type such as $Sinc^2$ $Sinc^4$, the essential condition being that the last coefficient is equal to 0. For instance, with a $Sinc^2$ filter, the device of the invention would have only two accumulators and the same oscillator could be used, but one of the three cycles composing a period of clock F would be idle. With a $Sinc^4$ filter, the device would require four accumulators, and an oscillator having a frequency of 4F would be required in order to have each period of clock F divided into four elementary cycles. The present invention has been described by means of an embodiment, the functions of which are performed in using logic circuits. But it is within the skill of the man of ordinary skill in the art to perform all these functions by software under the control of a general purpose processor, or by implementing a special purpose processor using the teachings of the present description.

We claim:

1. Digital filter receiving input digital signals at a rate provided by a first clock at a frequency F and providing output digital signals at a rate provided by a second clock at a frequency f which is a submultiple of F, said first and second clocks being issued from a basic oscillator at a frequency XF, with said second clock being slowed down or sped up when it is no longer synchronous with a remote clock, said filter being of the type having a finite impulse response and a number of taps which number is a multiple X of the ratio between F and f and including a last zero value tap, said filter being characterized in that it comprises:

a plurality of accumulators (38, 40, 42), the number of which is equal to said multiple X, for accumulating during each period of said clock F, the product value which results from the multiplication of a predetermined input signal value (S) by one predetermined tap coefficient (H) dependent on the accumulator involved;

a processing circuit (34, 34, 36) for loading, during each cycle of said clock F, the product of said input signal value by said tap coefficient into each one of said plurality of accumulators;

an output circuit (48) for providing an output signal (P) at a rate f by outputting sequentially the contents of each accumulator at said rate f, and a multiplexing circuit (44) for selecting the accumulator, the contents of which has been output as said output digital signal, as the accumulator to be loaded first said processing circuit, whereby the last product which is accumulated in the accumulator to be output is always zero due to said last zero value tap, enabling the corresponding time interval to be used for adjustment of said frequency f by skipping a time interval corresponding to a cycle of said basic oscillator when a speeding up action of said second clock is required or by adding a time interval corresponding to a cycle of said basic oscillator when a slowing down action of said second clock is required.

2. A programmable data formatter responsive to pixel data triples having D in number of, E in number of and F in number of bits respectively representing three different color intensities. D, E and F each being integers, and producing therefrom respective individual pixel intensity values having d in number of, e in number of and f in number of bits to be stored in a plurality, (d+e+f) in number, of bit-planes of a frame buffer having a number of bit-planes at least equal to the sum (d+e+f), d, e and f each being integers also, and (d+e+f)<(D+E+F), the programmable data formatter comprising;

rendering means for producing pixel data triples having D in number, E in number and F in number of bits respectively representing different color intensities;

a first register of ordered bits, (D+E+F) in number, and having respective inputs and outputs for each bit, E in number of those inputs respectively coupled to the E in number of bits of color intensity and F in number of those inputs respectively coupled to the F in number of bits of color intensity;

a first shifting means, having inputs respectively coupled to the D in number of bits of color intensity and having outputs respectively coupled to D in number of the inputs to the first register means, for causing a contiguous subset of d in number of the D in number of bits of color intensity to be applied to a first contiguous subset of the D in number of inputs of the first register, 0<=d<=D and the first contiguous subset starting with the least significant input among the D in number of first register inputs in the ordering thereof;

a second register of ordered bits, (D+E+F) in number, and having respective inputs and outputs for each bit, F in number of those inputs respectively coupled to the F in number of outputs of the first register;

a second shifting means, having inputs respectively coupled to the D in number of and E in number of outputs of the first register and having outputs respectively coupled to the D in number of and E in number of inputs of the second register, for causing a contiguous subset of (d+e) in number of the D in number of and E in number of outputs of the first register to be applied to a second contiguous subset of the D in number of and E in number of inputs of the second register, 0<=e<=E and the second contiguous subset starting with the least significant input among the D in number of and E in number of second register inputs in the ordering thereof;

a third register of ordered bits, having at least (d+e+f) in number of such ordered bits, 0<=f<=F, and having respective inputs and outputs for each bit;

a third shifting means, having inputs respectively coupled to the D in number of E in number of and F in number of outputs of the second register and having outputs respectively coupled to the at least (d+e+f) in number of inputs of the third register means, for causing a contiguous subset of (d+e+f) in a number of outputs of the second register to be applied to a third contiguous subset of the at least (d+e+f) in number of inputs of the third register, the third contiguous subset starting with the least significant input among the at least (d+e+f) in number of third register inputs in the ordering thereof; and a frame buffer of at least (d+e+f) in number of bit planes respectively coupled to the at least (d+e+f) in number of bits of the third register.

3. A programmable data formatter as in claim 2 further comprising programming register means having outputs coupled to the first, second and third shifting means for determining the values of d, e and f.

4. Digital filter according to claim 2 wherein, when said second clock (f) is synchronized to said remote clock by a speeding up action, said first clock (F) is adjusted by skipping a cycle of said oscillator in a period of said first clock, whereby said output signal (P) which is output from said accumulator at the end of said period is not erroneous due to said speeding up action since the last product skipped by this action involves said last zero value and therefore is equal to zero.

5. A method of double buffering images stored in a frame buffer having M in number of bit-planes, M being an integer, the method comprising the steps of:

a. partitioning the frame buffer into a first sub-buffer of D in number of, E in number of and F in number of bit-planes, D+E+F=J, and a second sub-buffer of D' in number of, E' in number of and F' in number of bit-planes, where each of D, E, F, D',E',F' and J are integers, and D'+E'+F'=K, D=D',E=E', F=F' and J+K<=M, K being an integer also;

b. logically ordering the first and second sub-buffers as a set {D in number: D' in number: E in number: E' in number: F in number: F' in number} of bit-planes;

c. rendering a plurality of pixel data values d, e and f each associated with a same pixel that is part of a first image;

d. selecting as U the (D+D') in number of most significant bits of d;

e. concatenating U with e and f to obtain the logical order {U:e:f};

f. selecting as V from the result of step e the (E+E') in number of most significant bits of e;

g. concatenating U, V and f from the result of steps e and f to obtain the logical order {U:V:f};

h. selecting as W from the results of step g the (F+F') in number of most significant bits of f;

i. concatenating U, V and W from the results of steps g and h to obtain the logical order {U:V:W}, thereby obtaining the equivalent logical order {D:D':E:E':F:F'};

j. enabling only the D in number of, E in number of and F in number of bit-planes associated with the first sub-buffer; and then k. subsequent to step j, performing a write memory cycle from the logical order obtained in step i, whereby reduced precision data values of the same pixel that is part of the first image is written into the first sub-buffer;

l. repeating steps c through k until the first image has been stored in the first sub-buffer;

m. rendering a plurality of pixel data values d',e' and f' each associated with another same pixel that is part of a second image;

n. selecting as U' D in number of most significant don't care bits conjoined as least significant bits by D' in number of most significant bits of d';

o. concatenating U' with e' and f' to obtain the logical order {U':e':f'};
p. selecting as V' from the result of step o E in number of most significant don't care bits conjoined as least significant bits by the E' in number of most significant bits of e';
q. concatenating U', V' and f' from the results of steps o and p to obtain the logical order {U':V':f'};
r. selecting as W' from the result of step q F in number of most significant don't care bits conjoined as least significant bits by the F' in number of most significant bits of f';
s. concatenating U', V' and W' from the results of steps q and r to obtain the logical order {U':V':W'}, thereby obtaining the equivalent logical order {D don't care:D':E don't care:E':F don't care:F'};
t. enabling only the D' in number of, E' in number of and F' in number of bit planes associated with the second sub-buffer; and then
u. subsequent to step t, performing a write memory cycle from the logical order obtained in step s, whereby reduced precision data values of the other same pixel that is part of the second image is written into the second sub-buffer; and
v. repeating steps m through u until the second image has been stored in the second sub-buffer.

6. Digital filter according to claim 2 wherein, when said second clock (f) is synchronized to said remote clock by a speeding up action, said first clock (F) is adjusted by advancing by three cycles of said oscillator the output of said output signal (P) from said accumulator, whereby said output signal is not erroneous due to said speeding up action since the last product, which would have been accumulated in the absence of said speeding up action, involves said last zero value and therefore is equal to zero.

7. Digital filter according to claim 1 or 2 or 3 or 4 or 5 or 6 used in a Sigma-delta analog-to-digital converter, and wherein said input digital signals are a string of bits received from a Sigma-delta coder (10) at said frequency F, and said output digital signals are digital words representing Pulse Coded Modulation samples produced at the sampling frequency f.

8. Digital filter according to claims 1, 2, 3, 4, 5 or 6 further comprising: a control circuit providing control signals to said accumulators (38, 40, 42) said processing circuit (32, 34, 36), said output circuit (48) and said selecting circuit (44), said control circuit including:
  a cycle counter (60) for generating output pulses corresponding to said first clock F in response to input pulses corresponding to said second clock f, said output pulses taking into account the slowing down or speeding up actions on said input pulses;
  a window counter (62) for generating window signals corresponding to windows each determining the order said accumulators are loaded during a period of said clock F, in response to the output signal from one accumulator, and
  a logic circuit (72) for generating said control signals in response to said output pulses and said window signals.

9. Digital filter according to claims 1, 2, 3, 4, 5 or 6 wherein said first clock has frequency F=864 kHz, said second clock has a frequency f=14.4 kHz, said filter being of the type Sinc$\eta$ including 3F/f=180 taps.

10. Digital filter according to claims 1, 2, 3, 4, 5 or 6 wherein: said filter is being used in the analog-to-digital converter of a modem.

* * * * *